US006563139B2

(12) United States Patent
Hen (10) Patent No.: US 6,563,139 B2
(45) Date of Patent: May 13, 2003

(54) PACKAGE STRUCTURE OF FULL COLOR LED FORM BY OVERLAP CASCADED DIE BONDING

(76) Inventor: Chang Hsiu Hen, No. 33, Alley 32, Lane 91, Hsuei-tien St., Hsin-Chu (TW)

(*) Notice: Subject to any disclaimer, the term of this patent is extended or adjusted under 35 U.S.C. 154(b) by 0 days.

(21) Appl. No.: 10/001,419

(22) Filed: Nov. 15, 2001

(65) Prior Publication Data

US 2003/0047742 A1 Mar. 13, 2003

(30) Foreign Application Priority Data

Sep. 11, 2001 (TW) ................................. 090122555 A (51) Int. Cl.[7] .............................................. H01L 33/00
(52) U.S. Cl. ........................... 257/89; 257/79; 257/82; 257/85; 257/90; 257/94; 257/96; 257/97; 438/22; 438/24; 438/28; 438/46; 438/47
(58) Field of Search ......................... 257/89, 79, 85, 257/82, 90, 94, 96, 97; 438/22, 28, 24, 46, 47, 956

(56) References Cited

U.S. PATENT DOCUMENTS

| | | | | |
|---|---|---|---|---|
| 5,459,337 A | * | 10/1995 | Ito et al. ........................ | 257/89 |
| 5,583,351 A | * | 12/1996 | Brown et al. ................... | 257/89 |
| 5,650,641 A | * | 7/1997 | Sassa et al. ..................... | 257/89 |
| 5,739,552 A | * | 4/1998 | Kimura et al. .................. | 257/89 |
| 5,898,185 A | * | 4/1999 | Bojarczuk, Jr. et al. ..... | 257/103 |
| 5,952,681 A | * | 9/1999 | Chen ............................ | 257/89 |
| 2001/0007360 A1 | * | 7/2001 | Yoshida et al. ............... | 257/89 |

* cited by examiner

Primary Examiner—David Nelms
Assistant Examiner—Andy Huynh
(74) Attorney, Agent, or Firm—Perkins Coie LLP (57) ABSTRACT

The present invention discloses a light source of full color LED (light emitted diode) by using die bond and packaging technology. A first mono-color LED chip with reflective metal on the bottom and transparent metal-oxide on the top of the chip is bonded on the PC board by thermal or ultrasonic die bond. A second mono-color LED chip with reflective metal on both sides is bonded in cascade on the first LED chip by thermal or ultrasonic die bond. The first LED chip emits light through the transparent metal-oxide to mix with the second LED light such that a different color light will obtain. The reflective metal reflects all the light to enforce the light intensity. In near field application, a red, a blue and a green LED are die bond in cascade to get a white light or full color light. In far field application, a yellow and a blue LED are die bond in cascade on the PC board, in its side is another cascaded die bond of a red and a green LED to get a white light or full color light.

23 Claims, 8 Drawing Sheets

Red(R): 400 -1000 μm
Blue(B): 300 - 900 μm
Green(G): 200 - 800 μm

Blue(B): 200 - 900 μm  Green(G): 200 - 600 μm
Yellow(Y): 300 – 1000μm  Red(R): 300 -700 μm

PACKAGE STRUCTURE OF FULL COLOR LED FORM BY OVERLAP CASCADED DIE BONDING

BACKGROUND OF THE INVENTION

1. Field of the Invention

The present invention related to a packaging structure of LED and more particularly, to a package structure of overlap bonding the LEDs in cascaded by chip direct bounding with transparent conductive layer and reflected metal layer, and capable of generating a full color light or white light by mixing lights emitted from the overlap LEDs.

2. Description of Relative Prior Art

As a good light source and device made by semiconductor material, LEDs possesses advantages of small size, long life-time, low driving voltage, rapid response, and good oscillation-proof, etc.

By changing the semiconductor materials and device structures, LEDs with different visible and invisible colors can be designed, wherein AlGaAs, InGaAlP and InGaN are suitable for producing LEDs with high luminance over 1000 mcd.

When producing red or infrared LEDs with high luminance by AlGaAs, an LPE process and DE structure devices are used for industrial mass production.

Figure 1:
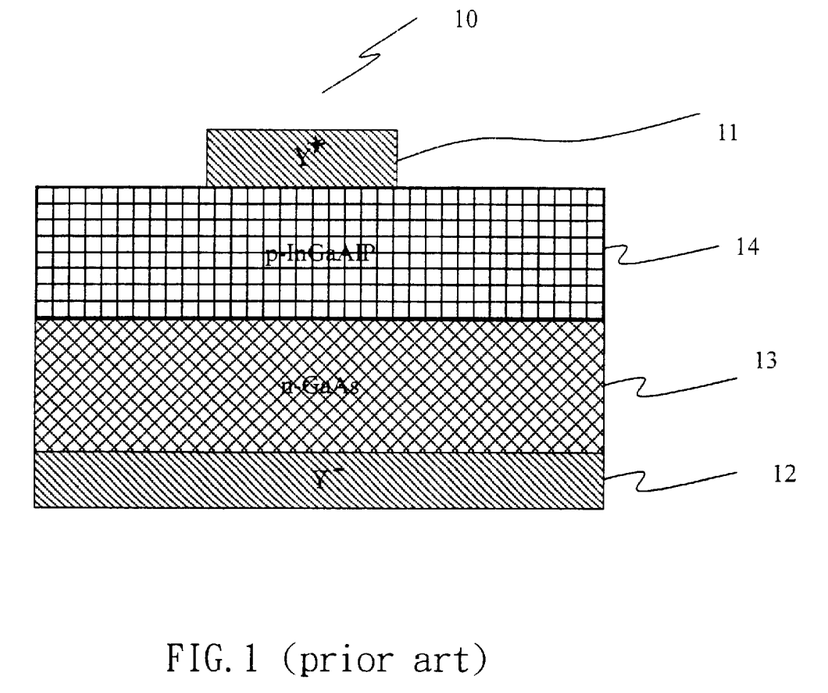
FIG. 1 shows the cross section of a traditional yellow light LED chip

InGaAlP can be used to produce red, orange, yellow and yellow-green LEDs, and an MOVPE (Metal Organic Vapor Physical Epitaxy) process, double hetero (DH) junction structures, and quantum well (QW) structures are provided in efficient mass production. FIG. 1 shows the cross section of a traditional InGaAlP/GaAs or InGaAlP/GaP yellow semiconduct;or LEDs 10, wherein an InGaAlP epitaxial layer 14 is formed on an n-type GaAs substrate 13. A positive bond pad 11 is formed by gold (Au) for being connected to an anode package leg, and a negative bond pad 12 is formed by Al or Au and connected to a cathode package leg.

Figure 2:
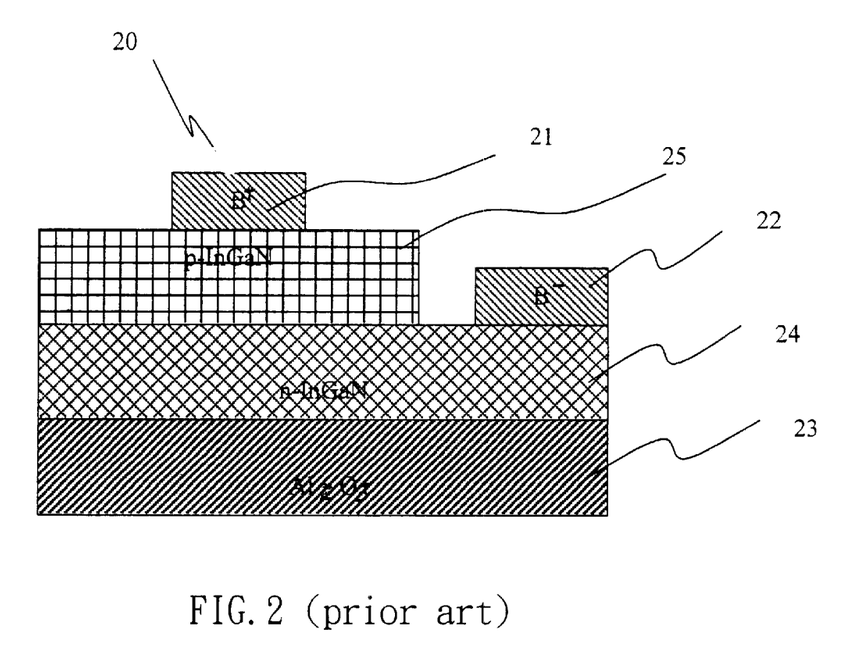
FIG. 2 shows the cross section of a traditional blue light LED chip

InGaN is suitable for producing green, blue and ultraviolet LEDs with high luminance by high temperature MOVPE processes, wherein DH structures and QW structures are used, too. FIG. 2 shows the cross section of a traditional blue LED die 20, wherein a substrate 23 is formed by transparent sapphire. An upper p-type InGaN epitaxial layer 25 and a lower n-type InGaN epitaxial layer 24 are deposited on the substrate 23. A positive bond pad 21 is formed on the p-type InGaN for being connected to an anode package leg, and a negative bond pad 22 is formed on the n-type InGaN for being connected to a cathode package leg. Alternatively, the n-type InGaN epitaxial layer 25 can be epitaxied on the p-type InGaN epitaxial layer 24. As shown in FIG. 2, the sapphire substrate 23 as a support base results in a different connecting type for the negative bond pad 22 from FIG. 2.

Figure 3:
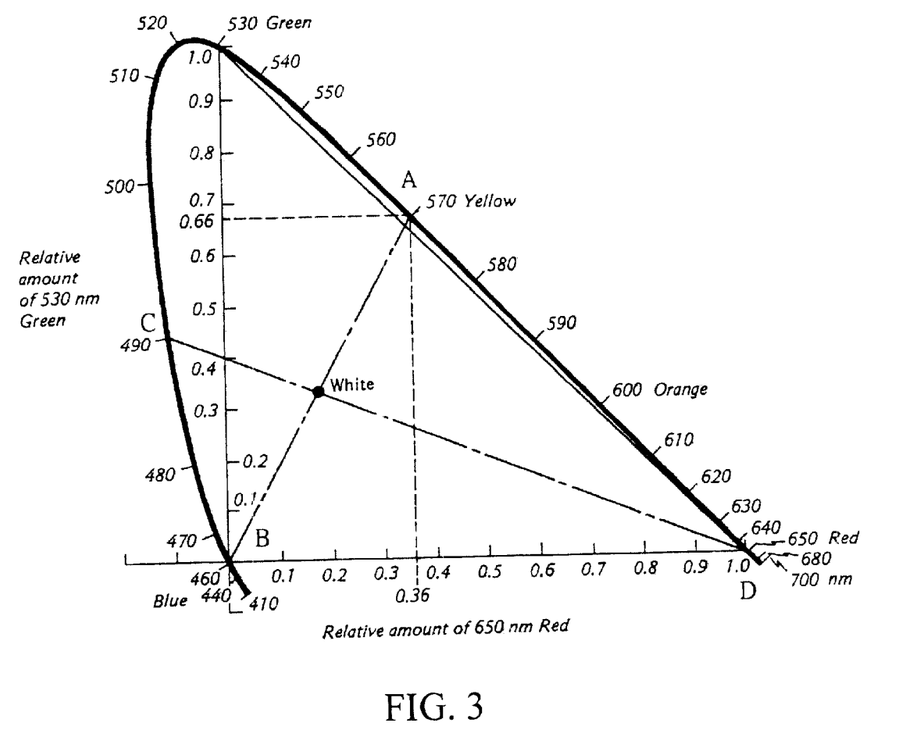
FIG. 3 is a chromaticity diagram
Figure 4:
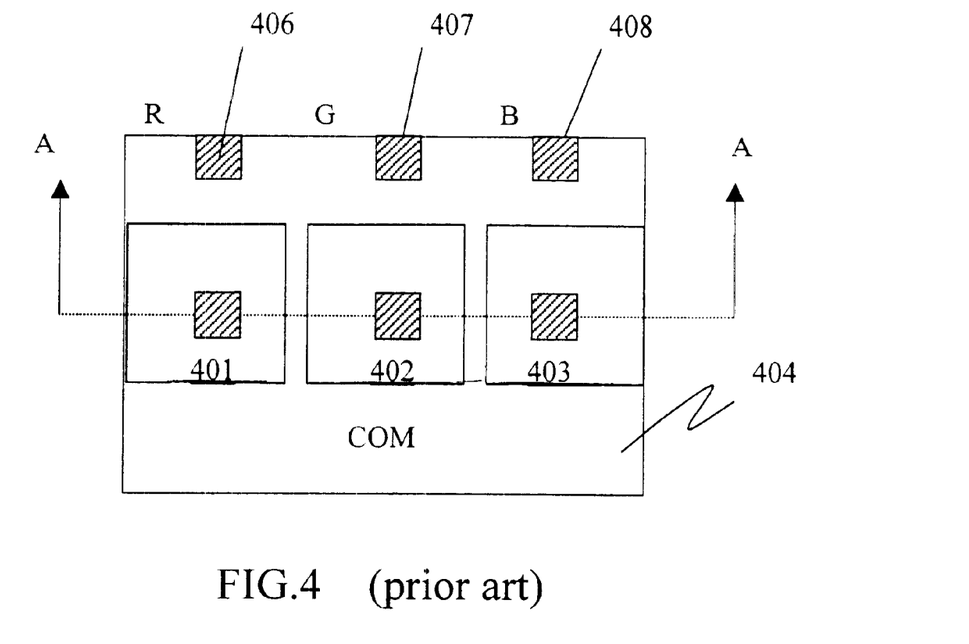
FIG. 4 is the top view of a full color LED package with the three primary colors in a row of a prior art
Figure 5:
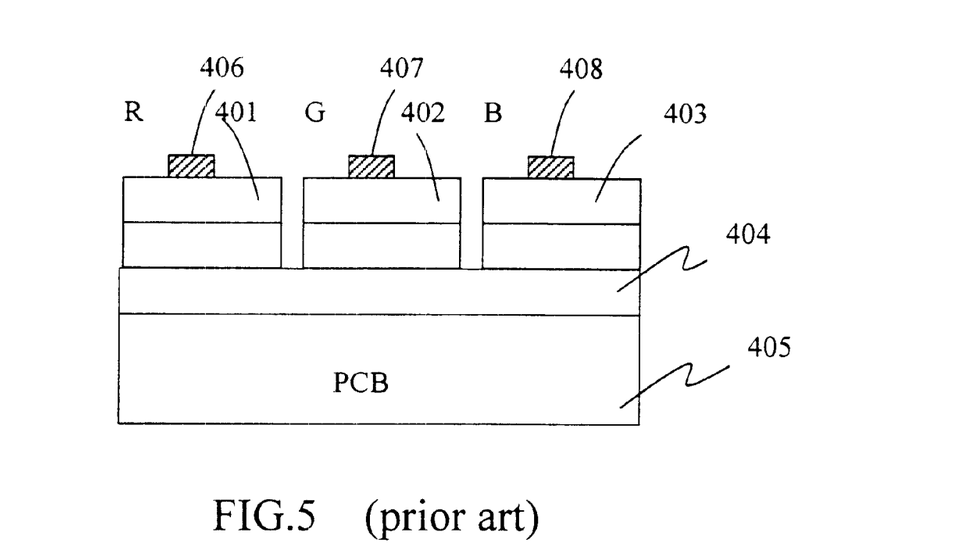
FIG. 5 is the cross section along A—A line of FIG. 4
Figure 6:
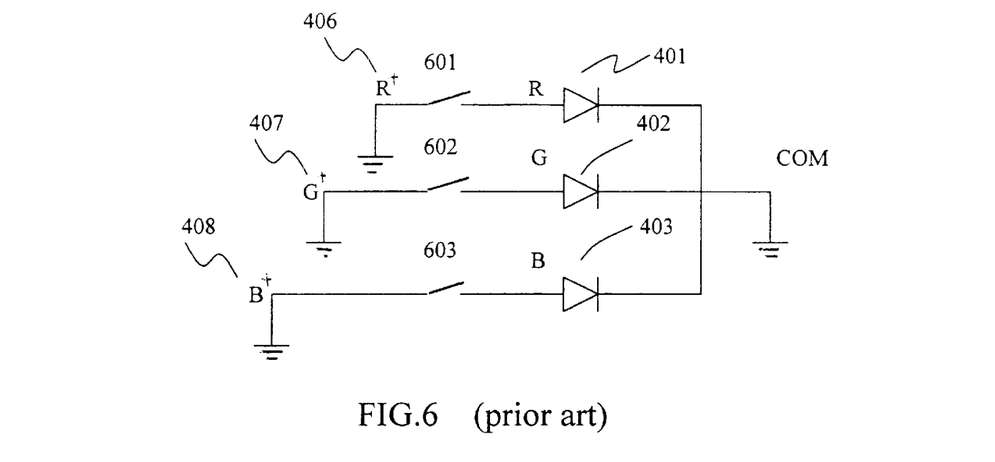
FIG. 6 is the equivalent circuit of the bias method of FIG. 4

In order to get colors other than red, green and blue light by adjusting the intensity of the primary color of red, green and blue lights as shown in the chromaticity diagram in FIG. 3. In the figure, if we adjust the blue and yellow light intensity along line AB, we shall have a white light in the intersection of line AB and CD; apart from the intersection and near point A we have bluish color. If there are red, blue and green primary colors, by adjusting the intensity of each color. We shall have full color light source. As shown in FIG. 4, a conventional method of forming a full color LED, a red, a green and a blue primary color LEDs are packaged with chips 401, 402 and 403 in a row or in array by die bond on a PC board. The power of the red LED is apply to the positive pad 406 and via the ground pad 404 on the PC board 405 to the negative of the source, the same method is apply to the green and blue LEDs. Generally, a constant current source of 20 mA is used as the power source as shown in FIGS. 4 and 5.

For example, 20 mA with voltage of 2V is applied to the red LED 401; 20 mA with voltage of 3.5V is applied to the green LED 402 and 20 mA with voltage of 3.5V is applied to the blue LED 403, a white light is obtained and the power consumption is 180 mW (20×2+20×3.5+20×3.5=180 mW); if full color is needed, the current is still kept at 20 mA, but by control the lighting period of each LED to combined the light to obtain different colors. The control accuracy is difficult to obtain, and the design of the power control IC is complicated, more ever, for constant current much heat generated and heat dispersion is not easy, it causes short lifetime of the LED. In near field observation, three colors is still observed, full color can be observed only for far field observation, so it does not satisfy the need of the market.

SUMMARY OF THE INVENTION

The object of the present invention is to provide an overlap cascaded packaging structure of a full color semiconductor LED to satisfy near field or far field display application.

Another object of the present invention is to provide an overlap cascaded packaging structure of a full color semiconductor LED with reflected metal layer to enhance the intensity of light.

Another object of the present invention is to provide a light source with metal oxide transparent conductive layer to die bond multi-chip to form overlap cascaded packaging structure. The structure has good resolution and is satisfied for both near field or far field observation.

The other object of the present invention is to provide an overlap cascaded packaging structure of a full color semiconductor LED to obtain light source of different colors by controlling the magnitude of the current to control the intensity of the lights, this can achieve less power consumption and increase heat dispersion efficiency.

In order to achieve the above objects, a full color semiconductor LED, by using metal reflected layer and transparent conductive layer deposited on the red, blue, green or yellow LED to overlap bond the chips in cascade on a pc-board, at least includes: (a) a pc-board with a reflected metal layer deposited on it, the metal form a pattern which included a chip bonding pad, a red light positive bond pad, a blue light positive bond pad, a green light positive bond pad and a common negative bond pad; (b) a first red LED chip with a transparent conductive layer of red light positive electrode on the top side of the chip and a reflective metal layer of red light negative electrode on the bottom side of the chip, on one side of the positive electrode, a square reflective metal layer is deposited on the positive electrode to form a red light positive bond pad and to reflect the red light, the red light LED chip is bonded directly on the chip bonding pad of the pc-board; (c) a second blue LED chip with a transparent conductive layer on both side of the chip, the top layer form a positive electrode of the blue LED, on one side of the positive electrode, a square reflective metal layer is deposited on the positive electrode to form a blue light positive bond pad and to reflect the red light and blue light, on one side of the chip, a strip of the p-type semiconductor is etched away and a reflected metal layer is deposited to form a blue light negative bond pad, the blue light LED chip is overlap bond directly on the red LED chip in cascade; (d) a third green LED chip with a transparent conductive layer on both side of the chip, the top layer form a positive electrode of the green LED, on one side of the positive electrode, a square reflective metal layer is deposited on the positive electrode to form a green light positive bond pad and to reflect the red light, the blue light and the green light, on one side of the chip, a square of the p-type semiconductor is etched away and a reflected metal layer is deposited to form a green light negative bond pad, the green LED chip is overlap bond directly on the blue LED chip in cascade; (e) using metal wire to connect the positive bond pad and negative bond pad of the first red LED, the second blue LED and the third green LED to the positive bond pads and negative bond pad of the pc-board.

The reflective metal layer on the pc-board and on the chip is aluminum, copper or gold, the thickness of the reflective metal layer isl 1000 Å to 20000 Å. It is better to be 2000 Å to 5000 Å.

The red LED chip is form by epitaxy n-type and p-type InGaN on a transparent sapphire substrate, the chip size is about 300 $\mu$m to 900 $\mu$m rectangular.

The green LED chip is also form by epitaxy n-type and p-type InGaN on a transparent sapphire substrate. The transparent conductive layer is Indium Oxide ($In_2O_3$)) or other transparent conductive layer, the thickness of the transparent layer is about 200 Å to 10000 Å, the better is 500 Å to 1000 Å. The size of the positive bond pad on the red, blue and green LED is about 50 $\mu$m to 200 $\mu$m, the better is 100 $\mu$m. The die is bonded at a temperature of 450° C. to 550° C., the eutectic point of the metal or metal oxide, or bonded by ultrasonic bonding, or adhered by a transparent epoxy material.

Another overlap cascaded packaging structure which is suitable for far field observation is form by overlap bonding of a blue light LED on a green light LED and a green light LED on a red light LED.

DETAIL DESCRIPTION OF THE PRESENT INVENTION

Hereunder, a first embodiment of an overlap cascaded three primary color dice packaging structure of a full color LED according to the present invention is described with reference to the attached drawings.

The LED dice used in this invention can be made with different type of material. The dice can be made by a conventional method accordance to the specification of this invention such as chip size, bias voltage, intensity, color and metal contact, etc. The dice should be tested and classified before packaging.

In the following embodiments, a pc-board with reflective metal pattern on the pc-board for die bonding, after the first chip is bond on the pc-board, a second chip is overlap and cascaded bond on the first chip. Bonding can be thermal, ultrasonic or transparent epoxy adhesion. A third chip is also over lap and cascaded bond on the second chip. Wire bond is then connected the positive electrode to the source and the negative electrode to the ground.

Figure 7:
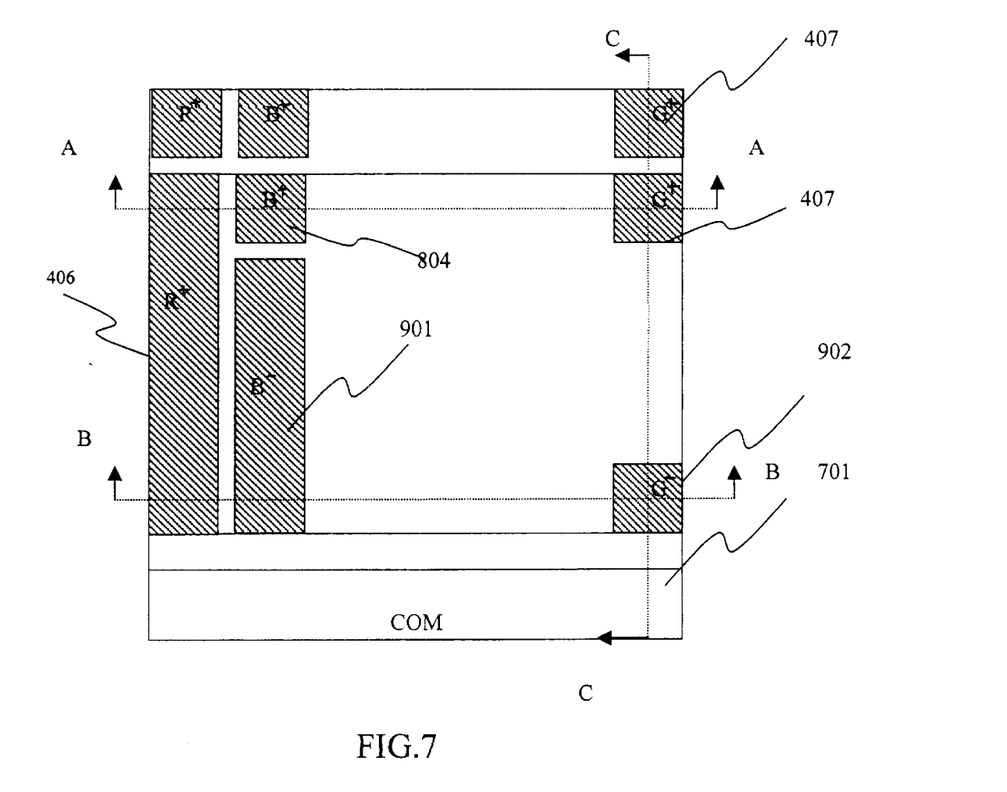
FIG. 7 shows the top view of an overlap cascaded three primary color, dice packaging structure of a full color LED suitable for near field observation in accordance with the present invention
Figure 8:
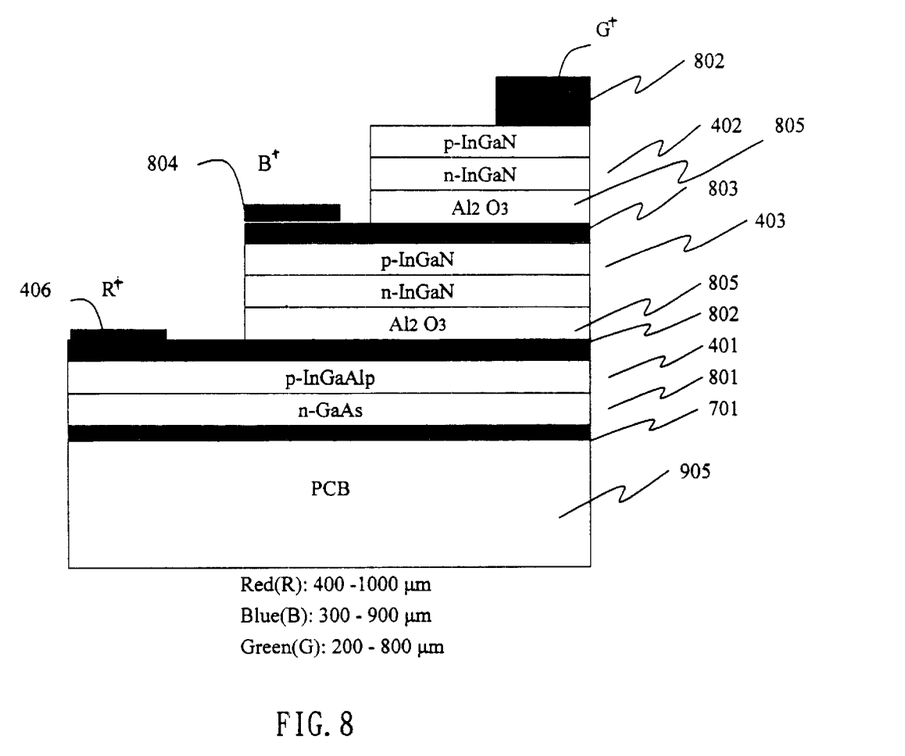
FIG. 8 is the cross section view along A—A line of the full color LED in FIG. 7
Figure 9:
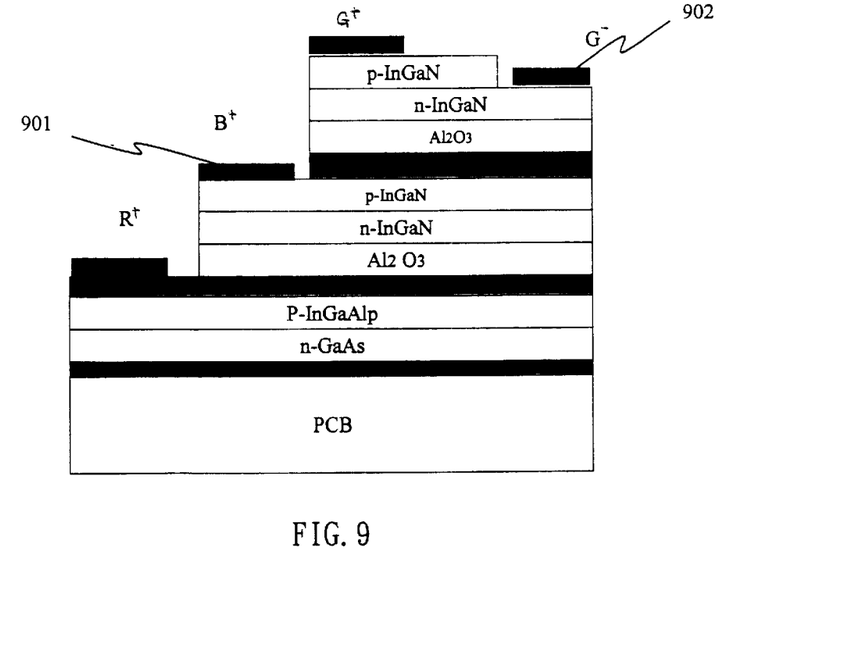
FIG. 9 is the cross section view along B—B line of the full color LED in FIG. 7
Figure 10:
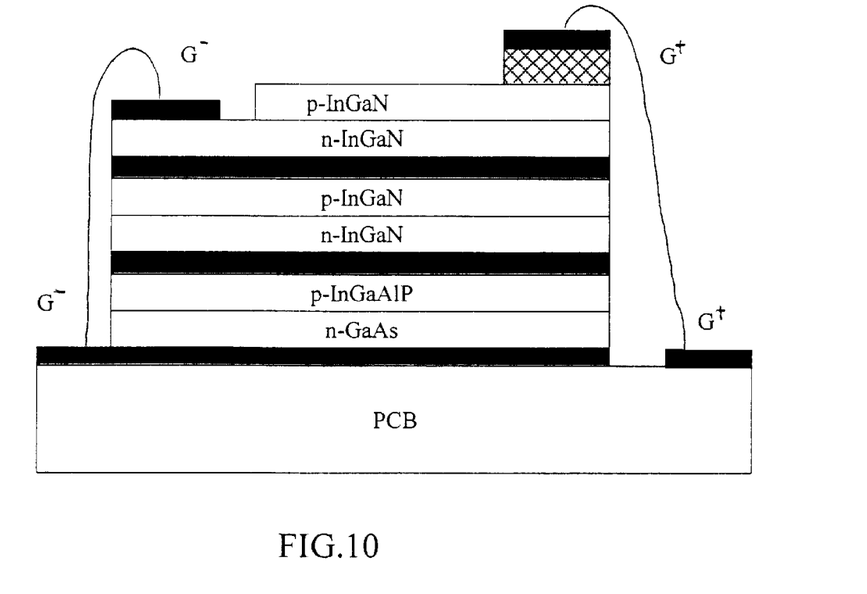
FIG. 10 is the cross section view along C—C line of the full color LED in FIG. 7
Figure 11:
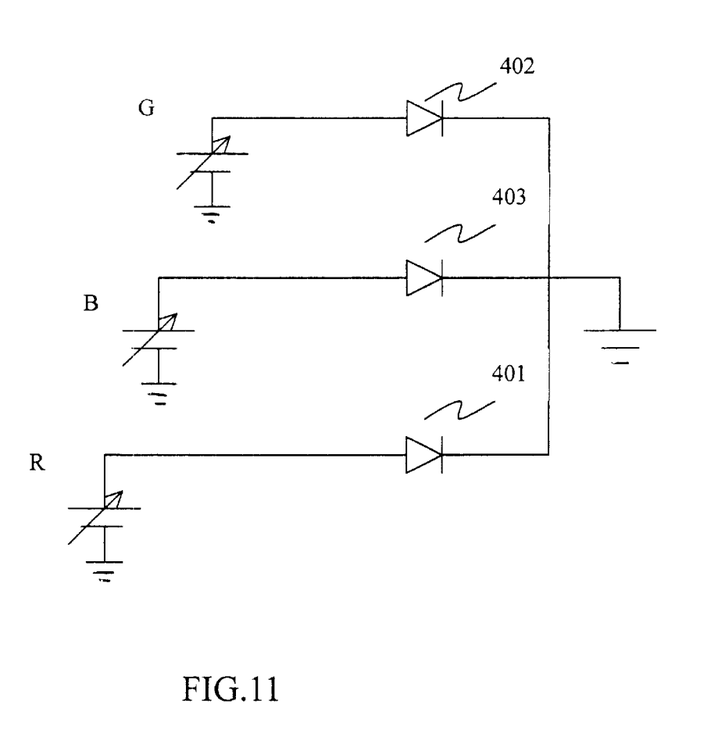
FIG. 11 is the equivalent circuit of the bias method of the full color LED in FIG. 7

FIG. 7 shows the top view of an overlap cascaded three primary dice packaging structure of a full color LED suitable for near field observation in accordance with the present invention. FIG. 8 is the cross section view along A—A line of the full color LED in FIG. 7. A reflective metal 801 is sputtered or evaporated or plated on the pc-board 405, the reflective metal is aluminum, copper or gold, with thickness of about 1000 Å to 20000 Å, the better of 2000 Å to 5000 Å. Then, prepare a first red light LED chip 401, which is made by conventional method to form p-type InGaAlP/n-type GaAs pn junction, a layer of aluminum, copper or gold with thickness of 1000 Å to 20000 Å, the better of 2000 Å to 5000 Å, is sputtered or evaporated on the bottom of the chip, on the top of the chip, a transparent conductive layer 802 with thickness of 200 Å to 10000 Å, the better of 500 Å to 1000 Å, is sputtered or evaporated, on one side on the top of the chip, a strip of reflective metal layer 406 with width of 50 $\mu$m to 200 $\mu$m, the better of 100 $\mu$m, is sputtered to reflect the red light and to be the positive bond pad, this prevent the red light emit without mixing with the other color light and become noise signal, and also reflect the red light to the reflective layer 801 then reflect upward again to mix with the other color light, so that the energy of the red light can be used completely. The size of the red light LED chip 401 is about 400 $\mu$m to 1000 $\mu$m. The red light LED 401 is then bonding to the pc-board 405 by heating to the eutectic point of metal, for example, 450° C. to 550° C., or by ultrasonic bonding or epoxy adhesion. The reflective metal layer on the bottom of the chip is then connected to the common ground electrode 701 (it is also the ground electrode of the red light LED) of the pc-board. A second blue light LED chip 403 is made by epitaxy an n-type InGaN on a transparent sapphire substrate 805, then a p-type InGaN is epitaied on the n-type InGaN to form a pn junction, The epitaxial is carry out by MOVPE technology. On the bottom and the top of the blue light chip, a transparent conductive layer 802 and 803 is sputtered or evaporated with thickness of about 200 Å to 10000 Å, the better of 500 Å to 1000 Å. On one side of, the top, a reflective metal strip 804 of aluminum, copper or gold with width of 100 μm is sputtered to reflect the red light and blue light and to be the positive electrode of the blue light LED chip. This layer prevent the mixed blue and red light emit without mixing with the green light and become noise signal, and also reflect the blue and red light to the reflective layer on the pc-board upward again to mix with the green light, so that the energy of the blue and red light can be used completely. A square of 100 μm×100 μm of the p-type InGaN is etched away and a reflective metal layer of copper or gold is sputtered on this area to reflect the red light and to be the negative electrode 901 of the blue light LED, as shown in FIG. 8, FIG. 9 and FIG. 10. The size of the blue LED chip is about 300 μm to 900 μm. The blue LED chip 403 is overlap cascaded bond to the red LED chip 401 by heating to the eutectic point of metal, for example, 450° C. to 550° C., or by ultrasonic bonding or transparent epoxy adhesion. A third green LED chip 402 is also made by epitaxy an n-type InGaN and p-type InGaN on a transparent sapphire substrate 805, which can be made by a traditional technology. On the bottom and the top of the green LED chip 402, a transparent conductive layer is sputtered with thickness of 200 Å to 1000 Å, the upper layer 803 is the positive electrode of the green LED chip. The negative electrode is form by etch away a square of 100 μm×100 μm of p-type InGaN and a reflective metal 902 of aluminum, copper or gold is sputtered. The reflective layer 902 reflect the blue and red light to prevent the mixed blue and red light emit without mixing with the green light to become noise signal, and also reflect the mixed blue and red light so that the blue and red light can be used completely, as shown in FIG. 8, FIG. 9 and FIG. 10. The size of the green LED chip 402 is about 200 μm to 800 μm. Then the green LED chip 402 is overlap bond in cascaded to the blue LED 403 by heating to the eutectic point of metal, for example, 450° C. to 550° C., or by ultrasonic bonding or transparent epoxy adhesion, as shown in FIG. 8, FIG. 9 and FIG. 10. Wire bond is then connect the red, blue and green LED positive bonding pad R+,B+ and G+ to the positive bonding pad of the red, blue and green light on the pc board respectively, and, the negative pad B−,G− of the blue and green LED to the common ground 701 on the pc-board, as shown in FIG. 7 and FIG. 10. The full color LED is then sealed with transparent plastic material. The package of the first embodiment is then completed. The equivalent circuit is shown in FIG. 11. It is value to notice that in this embodiment, different color is obtained by changing the bias of each color to change the current and thus different light intensity is mixed to form different color as shown in the chromaticity diagram of FIG. 3. This not only can save energy but also improve the resolution and quality of the color. Moreover, it needs not high current to emit light, the heat generated is less, and heat dissipation is good. The life time of the LED chips can be increased.

Figure 12:
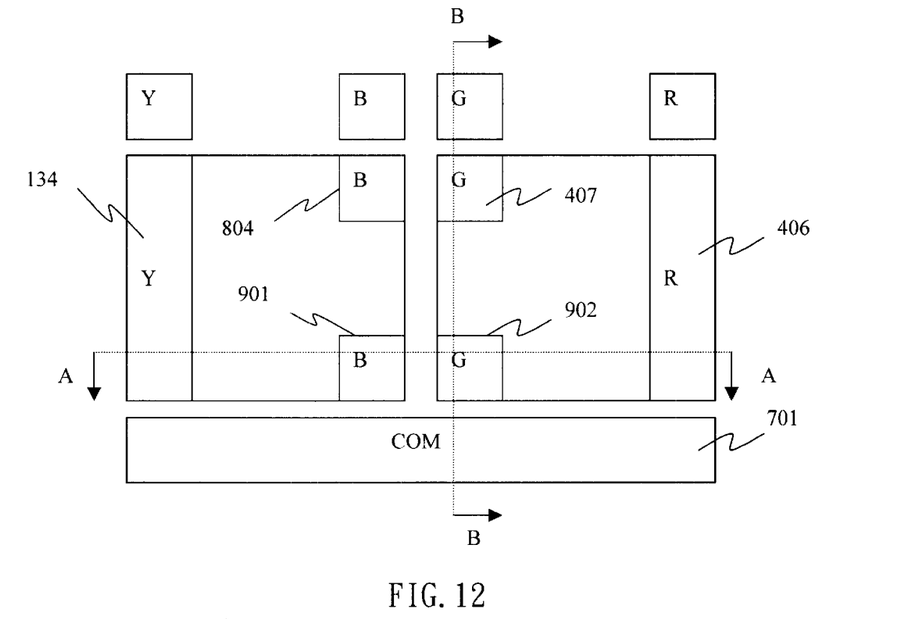
FIG. 12 shows the overlap cascaded two chip in parallel packaging structure of the full color LED suitable for far field observation in accordance with the present invention
Figure 13:
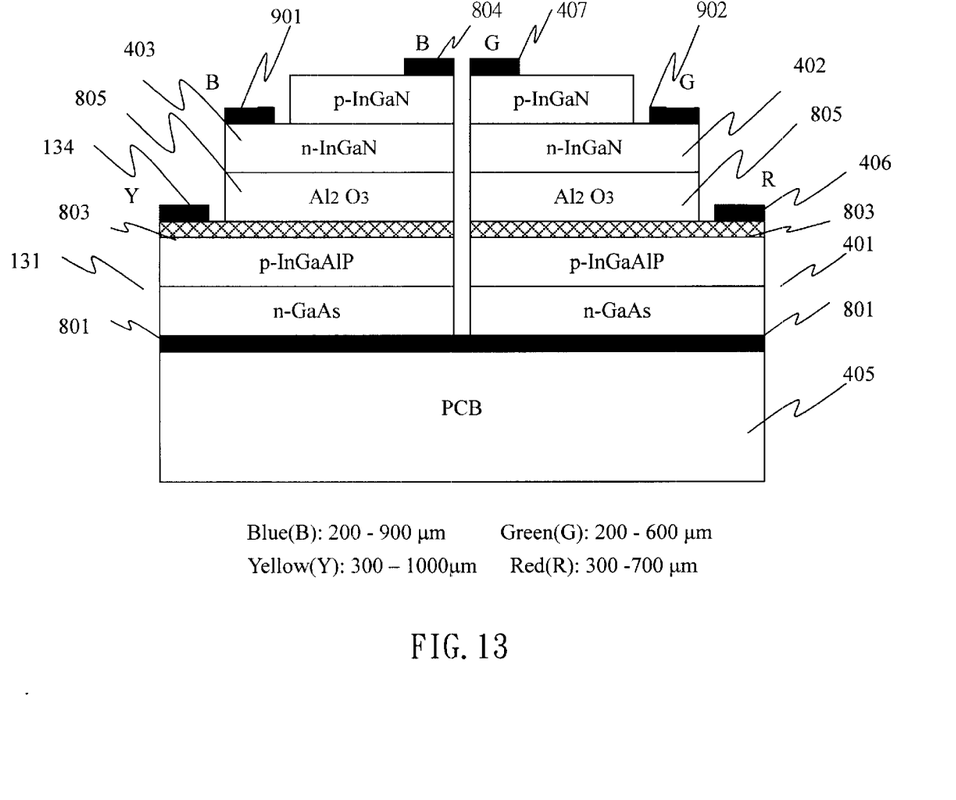
FIG. 13 is the cross section view along A—A line of the full color LED in FIG. 12
Figure 14:
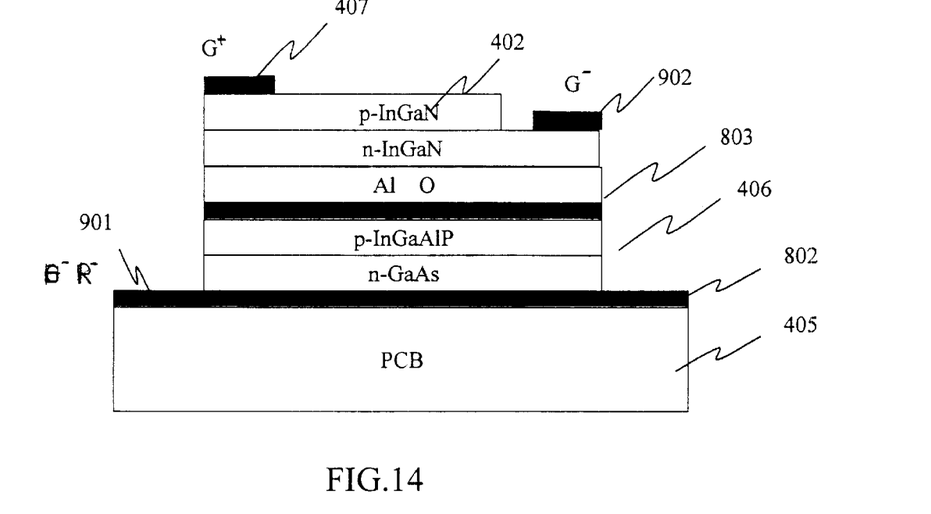
FIG. 14 is the cross section view along B—B line of the fall color LED in FIG. 12

The second embodiment of an full color LED packaging structure according to the present invention is made by overlap cascaded bonding of a yellow and a blue light LEDs in parallel with another overlap cascaded red and green light LEDs. This structure is suitable for far field observation and is described in FIG. 12 and FIG. 13. FIG. 12 is the plane view. FIG. 13 is the cross section along A—A line in FIG. 12. In order to simplify die bond and save energy, we do not use three primary color LEDs, instead we use only two LEDs in overlap cascaded, then package in parallel side-by-side with another two LEDs in overlap cascaded. This structure satisfy far field observation. Refer to FIG. 13, a reflective metal layer 801(aluminum, copper or gold) with thickness of 1000 Å to 20000 Å, the better of 2000 Å to 5000 Å is sputtered, evaporated or plated on a pc-board 405. Then prepare a first red LED chip 401, made by epitaxy a p-type InGaAlP on an n-type GaAs substrate with a traditional technology. On the bottom a reflective metal layer 801, with thickness of 1000 Å to 20000 Å, the better of 2000 Å to 5000 Å, is sputtered or evaporated. On the top, a transparent conductive layer 803 with thickness of 200 Å to 5000 Å, the better of 500 Å to 1000 Å is sputtered or evaporated. On one side of the top, a reflective strip layer of aluminum, copper or gold with width of 100 μm is sputtered to reflect the red light and to be the positive pad R+ 406 of the red LED, this prevent the red light emit forward alone to become noise signal, the reflected red light is then reflected upward by the reflective layer 801 on the pc-board and mixed with the green light above it. The size of the red LED is about 300 μm to 700 μm. The red LED is then thermally bond or ultrasonic bond or by transparent epoxy adhesion to the pc-board. The bottom metal 801 is connected to the common ground 701 of the pc-board or the negative electrode of the red light LED. Then prepare a second green light LED chip 402 which is made by traditional technology, for example, n-type InGaN/p-tpye InGaN on a sapphire 805, a transparent conductive layer 803 with thickness of 200 Å to 10000 Å, the better of 500 Å to 1000 Å is sputtered on the top and the bottom of the chip. The top layer is the positive electrode of the green light. A square bonding pad G+ 407 with width of 100 μm is sputtered and patterned on one side, The negative bonding pad G− 902 is made by etch away a square window of the p-type InGaN with size of 100 μm×100 μm, a reflective metal of copper or gold is sputtered on the window to form the negative bonding pad G− 902 of the green light. The reflective pad 902 is used to reflect the red light back to the reflective layer 801 on the pc-board 405 and reflect upward again to mix with the green light, which can save energy, as shown in FIG. 12 and FIG. 13. The green LED 402 is then overlap cascaded bond on the red LED chip 401 by thermal die bonding, or ultrasonic bonding, or transparent epoxy adhesion.

Figure 15:
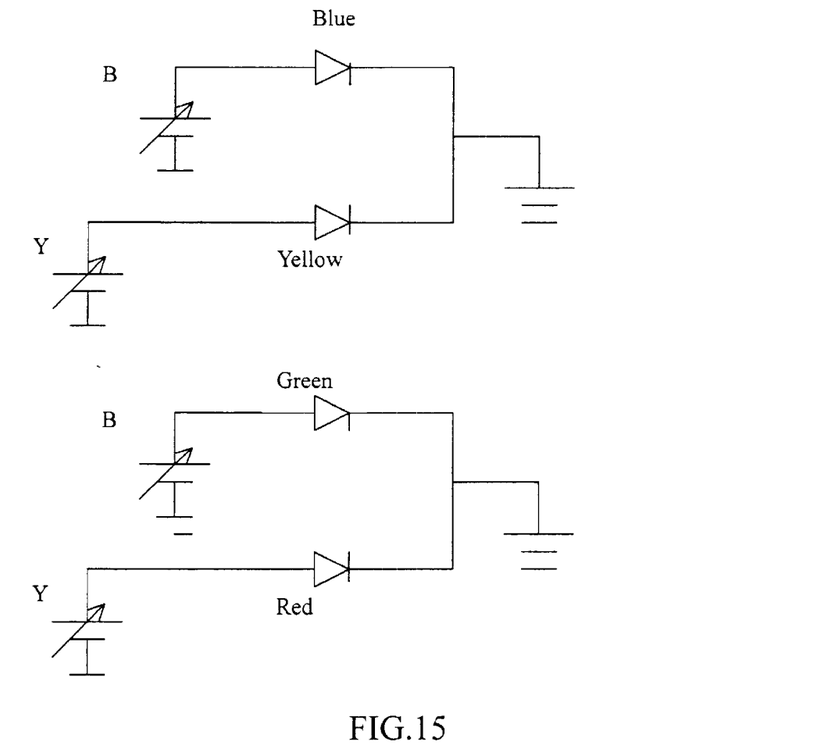
FIG. 15 is the equivalent circuit of the bias method of the full color LED in FIG. 12

The yellow LED chip 131 and the blue LED 403 is overlap cascaded bonded with the same method as that of the red LED chip and the green LED chip in parallel side-by-side as close as possible to the red and green LED, as shown in FIG. 12 and FIG. 13. The size of the yellow LED chip 131 is about 300 μm to 1000 μm. The size of the blue LED chip is about 200 μm to 900 μm. After the die bond is completed, wire bond is then connected the positive bonding pads R+ 406, G+ 407, B+ 804 and Y+ 134 and the negative bonding pads G− 902, B− 901 of the dice to the positive and negative bonding pad on the pc-board respectively. The full color LED is then sealed with transparent plastic material The equivalent circuit is shown in FIG. 15. It is value to notice that in this embodiment, different color is obtained by change the bias of each color to change the current and thus different light intensities are mixed to form different colors as shown in the chromaticity in FIG. 3. In this case, along line A-B (yellow to blue) and C-D (red to green), we can adjust the intensity to obtain any color, including the white light.

The third embodiment of an overlap cascaded packaging structure full color LED according to the present invention is by using of the left part (the yellow and blue light LED chips in overlap cascaded package) or the right part (the red and green LED chips in overlap cascaded package) independently. By adjusting the bias of each LED and with a constant current to obtain a white light LED luminescence or a full color LED.

The third embodiment does not limit to overlap cascaded package of the yellow and blue LED chips or the red and green LED chips, any two complementary color with which obtain a white light after mixed can be used. The materials used to fabricate the red, green, blue and yellow LEDs are not limited to the above materials, the structure of the diode is not limited to pn-junction structure, those advance technology such as quantum well structure can be used.

The embodiments mentioned above are only examples for explaining the present invention. Any similar products modified according to this disclosure should be regarded within the scope of the present invention.

What is claimed is:

1. A full color LED packaging structure containing three primary color LED dice bond in cascaded, by using a reflective metal layer and a transparent conductive layer to overlap bond the red, blue and green LED dice in cascaded on a pc-board, comprising:

(a) a pc-board, wherein a reflective metal layer is deposited and patterned to form a die bonding pad, a red LED positive bonding pad, a blue LED positive bonding pad, a green light positive bonding pad and a common ground bonding pad;

(b) a first red LED die having a transparent conductive layer of positive electrode and a reflective metal layer of negative electrode, the red LED die is directly overlap bond to the die bonding pad of the pc-board;

(c) a second blue LED die having a transparent conductive layer of positive and negative electrode, the blue LED die is directly overlap bond in cascaded on the red LED die;

(d) a third green LED die having a transparent conductive layer of positive and negative electrode, the green LED die is directly overlap bond in cascaded on the blue LED die;

(e) a plurality of bonding wires for electrically connecting the positive and negative bonding pads of the red LED die, the blue LED die and the green LED die to the positive bonding pads and the common ground bonding pad on the pc-board respectively.

2. The full color LED packaging structure according to claim 1, wherein the red LED die is a pn-junction diode form by epitaxy a p-type InGaP on an n-type GaAs substrate, the size of the die is 400 $\mu$m to 1000 $\mu$m rectangular.

3. The full color LED packaging structure according to claim 1, wherein a rectangular reflective metal layer is deposited on one side of the positive electrode of the red LED die to form the positive bonding pad of the red LED, and for reflecting the red light.

4. The full color LED packaging structure according to claim 1, wherein the blue LED die is a pn-junction diode form by epitaxy a p-type InGaN/p-type InGaN on a transparent sapphire substrate, the size of the die is 300 $\mu$m to 900 $\mu$m rectangular.

5. The full color LED packaging structure according to claim 1, wherein a square reflective metal layer is deposited on one side of the positive electrode of the blue LED die to form a positive bonding pad of the blue LED, and for reflecting the red and blue light, a rectangular strip of p-type InGaN is etch away and a reflective metal is deposited to form a negative bonding pad.

6. The full color LED packaging structure according to claim 1, wherein the green LED die is a pn-junction diode form by epitaxy an n-type InGaN/p-type InGaN on a transparent sapphire substrate, the size of the die is 200 $\mu$m to 800 $\mu$m square.

7. The full color LED packaging structure according to claim 1, wherein a square reflective metal layer is deposited on one side of the positive electrode of the green LED die to form the positive bond pad of the green LED, and for reflecting the red, blue and green light, a square of p-type InGaN is etch away and a reflective metal is deposited to form a negative bonding pad.

8. A full color LED packaging structure containing a blue LED die on a yellow LED die in parallel side-by-side with another green LED die on a red LED die, by using a reflective metal layer and a transparent conductive layer to bond the yellow LED die to a pc-board and the blue LED die is overlap cascaded bond to the yellow LED die, the red LED die is bond to the pc-board and the green LED die is overlap cascaded bond to the red LED die, comprising:

(a) a pc-board, wherein a reflective metal layer is deposited and patterned to form a die bonding pad, a red LED positive bonding pad, a blue LED positive bonding pad, a yellow LED positive bonding pad, a green LED positive bonding pad and a common ground bonding pad;

(b) a first yellow LED die having a transparent conductive layer of positive electrode and a reflective metal layer of negative electrode, the yellow LED die is directly overlap bond to the die bonding pad of the pc-board;

(c) a second blue LED die having a transparent conductive layer of positive and negative electrodes, the blue LED die is directly overlap bond in cascaded on the yellow LED die;

(d) a third red LED die having a transparent conductive layer of positive and negative electrodes, the red LED die is directly overlap bond to the die bonding pad of the pc-board in one side nearby the yellow and blue LED dice;

(e) a fourth green LED die having a transparent conductive layer of positive and negative electrodes, the green LED die is directly overlap bond in cascaded on the red LED die;

(f) a plurality of bonding wires for electrically connecting the positive and negative bonding pad of the yellow LED die, the blue LED, die, the red LED die and green LED die to the positive bonding pads and the common ground bonding pad on the pc-board respectively.

9. The full color LED packaging structure according to claim 8, wherein the yellow LED die is a pn-junction diode form by epitaxy a p-type InGaAlP on an n-type GaAs substrate, the size of the die is 300 $\mu$m to 1000 $\mu$m rectangular.

10. The full color LED packaging structure according to claim 8, wherein a rectangular reflective metal layer is deposited on one side of the positive electrode of the yellow LED die to form the positive bond pad of the red LED, and for reflecting the yellow light.

11. The full color LED packaging structure according to claim 8, wherein the blue LED die is a pn-junction diode form by epitaxy a p-type InGaN/p-type InGaN on a transparent sapphire substrate, the size of the die is 200 $\mu$m to 900 $\mu$m rectangular.

12. The full color LED packaging structure according to claim 8, wherein a square reflective metal layer is deposited on one side of the positive electrode of the blue LED die to form the positive bond pad of the blue LED, and for reflecting the yellow and blue light, a square of p-type InGaN is etch away and a reflective metal is deposited to form a negative bonding pad.

13. The full color LED packaging structure according to claim 8, wherein the red LED die is a pn-junction diode form by epitaxy a p-type InGaAlP on an n-type GaAs substrate, the size of the die is 300 $\mu$m to 700 $\mu$m rectangular.

14. The full color LED packaging structure according to claim 8, wherein a rectangular reflective metal layer is deposited on one side of the positive electrode of the red LED die to form the positive bond pad of the red LED, and for reflecting the red light.

15. The full color LED packaging structure according to claim 1 or 8, wherein the green LED die is a pn-junction diode form by epitaxy a p-type InGaN/p-type InGaN on a transparent sapphire substrate, the size of the die is 200 µm to 600 µm square.

16. The full color LED packaging structure according to claim 8, wherein a square reflective metal layer is deposited on one side of the positive electrode of the blue LED die to form the positive bond pad of the blue LED, and for reflecting the red and green light, a square of p-type InGaN is etch away and a reflective metal is deposited to form a negative bonding pad.

17. A full color LED packaging structure containing a first LED die and a second complementary LED die, by using a reflective metal layer and a transparent conductive layer, the first LED die is bond to a pc-board and the second complementary LED die is overlap cascaded bond to the first LED die, comprising:

(a) a pc-board, wherein a reflective metal layer is deposited and patterned to form a die bonding pad, a first LED positive bonding pad, a second complementary LED positive bonding pad and a common ground bonding pad;

(b) a first LED die having a transparent conductive layer of positive electrode and a reflective metal layer of negative electrode, the first LED die is directly overlap bond to the die bonding pad of the pc-board;

(c) a second complementary LED die having a transparent conductive layer of positive and negative electrodes, the second complementary LED die is directly overlap bond in cascaded on the first LED die;

(d) a plurality of bonding wires for electrically connecting the positive and negative bonding pads of the first LED die and the second complementary LED die to the positive bonding pads and the common ground bonding pad on the pc-board respectively.

18. The full color LED packaging structure according to claim 1, 8, or 17, wherein the reflective metal layer and bonding pad is aluminum, copper or gold, the thickness of this layer is 1000 Å to 10000 Å, the better is 2000 Å to 5000 Å.

19. The full color LED packaging structure according to claim 1, 8 or 17, wherein the overlap die bond is thermal bonding by heating to the eutectic point of metal at 450° C. to 550° C.

20. The full color LED packaging structure according to claim 1,8 or 17, wherein the transparent conductive layer is Indium oxide ($In_2O_3$) or other transparent conductive materials, with thickness of 200 Å to 10000 Å, the better of 500 Å to 1000 Å.

21. The full color LED packaging structure according to claim 1,8 or 17, wherein the square reflective metal positive and negative bonding pad is aluminum, copper or gold, with width of 50 µm to 200 µm, the better of 100 µm.

22. The full color LED packaging structure according to claim 1,8 or 17, wherein the overlap bond is ultrasonic bonding.

23. The full color LED packaging structure according to claim 1, 8 or 17, wherein the overlap bonding is by transparent epoxy adhesion.

* * * * *